(12) United States Patent
Kuzumoto et al.

(10) Patent No.: US 12,317,666 B2
(45) Date of Patent: May 27, 2025

(54) ORGANIC THIN FILM TRANSISTOR AND METHOD OF MANUFACTURING THE SAME AND THIN FILM TRANSISTOR ARRAY PANEL AND ELECTRONIC DEVICE

(71) Applicant: Samsung Electronics Co., Ltd., Suwon-si (KR)

(72) Inventors: Yasutaka Kuzumoto, Suwon-si (KR); Suk Gyu Hahm, Gyungju-si (KR); Jong Won Chung, Hwaseong-si (KR); Youngjun Yun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 519 days.

(21) Appl. No.: 17/678,453

(22) Filed: Feb. 23, 2022

(65) Prior Publication Data

US 2023/0131263 A1    Apr. 27, 2023

(30) Foreign Application Priority Data

Oct. 21, 2021    (KR) .......... 10-2021-0140946

(51) Int. Cl.
| | | |
|---|---|---|
| *H10K 10/46* | (2023.01) | |
| *H10D 86/40* | (2025.01) | |
| *H10D 86/60* | (2025.01) | |
| *H10K 71/20* | (2023.01) | |
| *H10K 77/10* | (2023.01) | |
| *H10K 102/00* | (2023.01) | |

(52) U.S. Cl.
CPC ......... *H10K 10/481* (2023.02); *H10K 71/233* (2023.02); *H10K 77/111* (2023.02); *H10D 86/471* (2025.01); *H10D 86/60* (2025.01); *H10K 2102/00* (2023.02)

(58) Field of Classification Search
CPC .... H10K 10/481; H10K 10/88; H10K 10/464; H10K 10/466; H10K 10/484; H10K 71/233; H10K 71/166; H10K 77/111; H10K 27/1251; H10K 2102/00
See application file for complete search history.

(56) References Cited

U.S. PATENT DOCUMENTS

| | | |
|---|---|---|
| 7,939,453 B2 | 5/2011 | Kano et al. |
| 9,401,487 B2 | 7/2016 | Im et al. |
| 9,478,727 B2 | 10/2016 | Bose et al. |
| 9,799,708 B2 | 10/2017 | Hong et al. |
| 9,887,373 B2 | 2/2018 | Lee et al. |
| 9,945,739 B2 | 4/2018 | Jeon et al. |
| 10,417,948 B2 | 9/2019 | Choi |

(Continued)

FOREIGN PATENT DOCUMENTS

| | | |
|---|---|---|
| JP | 2008-071781 A | 3/2008 |
| JP | 5360737 B2 | 12/2013 |

(Continued)

*Primary Examiner* — Fernando L Toledo
*Assistant Examiner* — Marshall Mu-Nuo Hatfield
(74) *Attorney, Agent, or Firm* — Harness, Dickey & Pierce, P.L.C.

(57) ABSTRACT

An organic thin film transistor includes a gate electrode, an organic semiconductor layer overlapped with the gate electrode, a hydrophilic nanolayer on the organic semiconductor layer, and a source electrode and a drain electrode electrically connected to the organic semiconductor layer.

8 Claims, 19 Drawing Sheets

(56) References Cited

U.S. PATENT DOCUMENTS

| | | | |
|---|---|---|---|
| 2003/0157432 A1* | 8/2003 | Rottstegge | G03F 7/0395 430/270.1 |
| 2010/0200844 A1* | 8/2010 | Chen | H10K 71/12 257/40 |
| 2010/0264408 A1* | 10/2010 | Bale | H10K 71/12 257/E33.044 |
| 2012/0273786 A1 | 11/2012 | Yahagi | |
| 2015/0070422 A1* | 3/2015 | Sumikawa | B41J 2/1433 347/10 |
| 2016/0365247 A1* | 12/2016 | Jin | H10D 62/121 |
| 2017/0224257 A1 | 8/2017 | Rogers | |
| 2017/0331045 A1 | 11/2017 | Chung et al. | |
| 2019/0244064 A1* | 8/2019 | Mahto | G06F 18/2411 |
| 2019/0333942 A1* | 10/2019 | Yamazaki | B23K 26/0006 |
| 2019/0372037 A1* | 12/2019 | Kim | H10K 85/6576 |
| 2020/0044089 A1* | 2/2020 | Zhang | H10D 99/00 |
| 2021/0036229 A1 | 2/2021 | Lee et al. | |
| 2021/0151680 A1* | 5/2021 | Yokoi | C08F 220/22 |
| 2021/0184165 A1* | 6/2021 | Pan | H10K 59/8731 |
| 2021/0225660 A1* | 7/2021 | Lian | C09K 13/00 |
| 2021/0296599 A1 | 9/2021 | Kim et al. | |
| 2021/0305286 A1* | 9/2021 | Li | H10D 86/481 |

FOREIGN PATENT DOCUMENTS

| | | |
|---|---|---|
| KR | 10-2010-0068749 A | 6/2010 |
| KR | 10-2015-0052763 A | 5/2015 |
| KR | 10-2021-0014566 A | 2/2021 |
| KR | 10-2021-0116061 A | 9/2021 |

* cited by examiner

ORGANIC THIN FILM TRANSISTOR AND METHOD OF MANUFACTURING THE SAME AND THIN FILM TRANSISTOR ARRAY PANEL AND ELECTRONIC DEVICE

CROSS-REFERENCE TO RELATED APPLICATION

This application claims priority to and the benefit of Korean Patent Application No. 10-2021-0140946 filed in the Korean Intellectual Property Office on Oct. 21, 2021, the entire contents of which are incorporated herein by reference.

BACKGROUND

1. Field

Organic thin film transistors, methods of manufacturing the same, thin film transistor array panels, and electronic devices are disclosed.

2. Description of the Related Art

A display device such as a liquid crystal display (LCD), an organic light emitting diode display (OLED display), or a quantum dot light emitting diode display includes a plurality of thin film transistors for independently switching and/or driving an element in each subpixel. Research on an organic thin film transistor (OTFT) including an organic semiconductor such as a low molecular weight semiconductor or polymer semiconductor instead of an inorganic semiconductor such as a silicon (Si) semiconductor as one type of the thin film transistor is being actively conducted. The organic thin film transistor may be made into a fiber or a film due to characteristics of an organic material, and thus is drawing attention as a core element for a flexible display device.

SUMMARY

In order to form an organic thin film transistor, a process of patterning an organic semiconductor may be performed. However, the organic semiconductor may be easily damaged by a chemical liquid used in the process, and the damaged organic semiconductor may deteriorate electrical characteristics of the organic thin film transistor.

Some example embodiments provide an organic thin film transistor capable of reducing or preventing deterioration of electrical characteristics of the organic thin film transistor by reducing or preventing damage to the organic semiconductor during a process.

Some example embodiments provide a method of manufacturing the organic thin film transistor capable of reducing or preventing damage to the organic semiconductor.

Some example embodiments provide a thin film transistor array panel including the organic thin film transistor.

Some example embodiments provide an electronic device including the organic thin film transistor or the thin film transistor array panel.

In some example embodiments, an organic thin film transistor may include a gate electrode, an organic semiconductor layer overlapped with the gate electrode, a hydrophilic nanolayer on the organic semiconductor layer, and a source electrode and a drain electrode electrically connected to the organic semiconductor layer.

The hydrophilic nanolayer may be in direct contact with an upper surface of the organic semiconductor layer and may cover all or a portion of the upper surface of the organic semiconductor layer.

The hydrophilic nanolayer may include a hydrophilic inorganic material, a hydrophilic organic material, a hydrophilic organic-inorganic material, or any combination thereof.

The hydrophilic inorganic material, the hydrophilic organic material, and the hydrophilic organic-inorganic material may be insoluble in water.

The hydrophilic inorganic material, the hydrophilic organic material, and the hydrophilic organic-inorganic material may each be an electrical insulator.

The hydrophilic nanolayer may include a metal oxide, a semi-metal oxide, or any combination thereof.

A thickness of the hydrophilic nanolayer may be greater than or equal to about 1 nm and less than about 10 nm.

The organic semiconductor layer may be hydrophobic.

According to some example embodiments, a method of manufacturing an organic thin film transistor may include forming a gate electrode, forming an organic semiconductor layer overlapped with the gate electrode, and forming a source electrode and a drain electrode electrically connected to the organic semiconductor layer, wherein the forming of the organic semiconductor layer includes forming an organic semiconductor thin film, forming a hydrophilic nanolayer on the organic semiconductor thin film, forming a protective interlayer on the hydrophilic nanolayer, performing a photolithography of the protective interlayer, the hydrophilic nanolayer, and the organic semiconductor thin film, and removing the protective interlayer.

The performing the photolithography of the protective interlayer, the hydrophilic nanolayer, and the organic semiconductor thin film may include applying a photoresist film on the protective interlayer, disposing a mask on the photoresist film and exposing a portion of the photoresist film, developing the exposed portion of the photoresist film to form a photoresist pattern, patterning the protective interlayer, the hydrophilic nanolayer and the organic semiconductor thin film using the photoresist pattern, and removing the photoresist pattern.

The photoresist film may include a fluorine-containing photoresist.

The protective interlayer may include a material different from that in the hydrophilic nanolayer.

The protective interlayer may include a water-soluble organic compound.

The hydrophilic nanolayer may include a hydrophilic metal oxide, a hydrophilic low molecular weight compound, or any combination thereof, and the hydrophilic metal oxide and the hydrophilic low molecular weight compound may be insoluble in water.

The hydrophilic nanolayer may be formed by vapor deposition, and the protective interlayer may be formed by a solution process.

The removing of the protective interlayer may include supplying water to the protective interlayer.

According to some example embodiments, a thin film transistor array panel including the organic thin film transistor is provided.

The thin film transistor array panel may further include a substrate supporting the organic thin film transistor, and the substrate may be a stretchable substrate.

According to some example embodiments, an electronic device including the organic thin film transistor or the thin film transistor array panel is provided.

It may be possible to prevent deterioration of the electrical characteristics of the organic thin film transistor by reducing damage to the organic semiconductor during the process.

DETAILED DESCRIPTION

Figure 1:
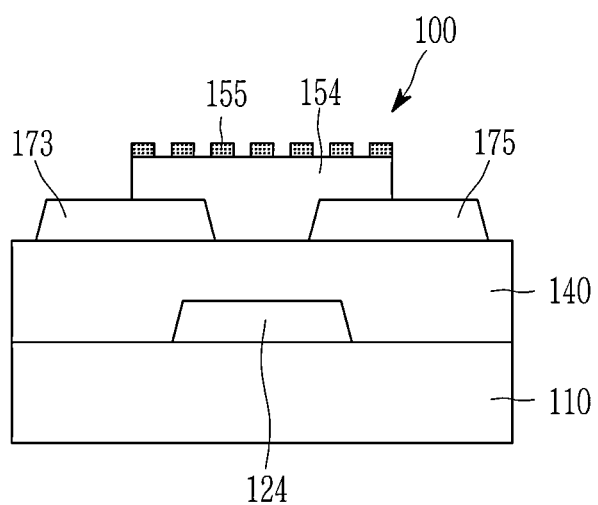
FIGS. 1, 2, 3, 4, 5, 6, 7, and 8 are cross-sectional views showing examples of an organic thin film transistor according to some example embodiments.

Example embodiments will hereinafter be described in detail, and may be easily performed by a person having an ordinary skill in the related art. However, the inventive concepts may be embodied in many different forms and are not to be construed as limited to the example embodiments set forth herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity of the example embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a silyl group, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

As used herein, when a definition is not otherwise provided, "hetero" refers to inclusion of one to four heteroatoms selected from N, O, S, Se, Te, Si, and P.

As used herein, "polymer" includes a homopolymer, a copolymer, or any combination thereof.

As used herein, "combination" includes a mixture, a composite, or a stacked structure of two or more.

It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the term "about" or "substantially" is used in this specification in connection with a numerical value, it is intended that the associated numerical value includes a manufacturing or operational tolerance (e.g., ±10%) around the stated numerical value.

Hereinafter, an organic thin film transistor according to some example embodiments will be described with reference to the drawings.

FIGS. 1, 2, 3, 4, 5, 6, 7, and 8 are cross-sectional views showing examples of an organic thin film transistor according to some example embodiments.

Referring to FIGS. 1 to 8, an organic thin film transistor 100 according to some example embodiments includes a gate electrode 124 on a substrate 110; an organic semiconductor layer 154 overlapped with the gate electrode 124 along the thickness direction of the substrate 110 (e.g., overlapped in the direction extending perpendicular to the upper surface of the substrate 110 that is proximate to the gate electrode 124); a hydrophilic nanolayer 155 on the organic semiconductor layer 154; a gate insulating film 140 between the gate electrode 124 and the organic semiconductor layer 154; and a source electrode 173 and a drain electrode 175 electrically connected to the organic semiconductor layer 154.

The organic thin film transistor 100 may have a bottom gate structure, a top gate structure, a bottom contact structure, and a top contact structure depending on a position of the gate electrode 124 and/or a channel position of the organic semiconductor layer 154, and may be variously implemented by combining them.

First, referring to FIG. 1, the organic thin film transistor 100 according to one example may be an organic thin film transistor having a bottom gate structure and a bottom contact structure, and specifically, includes a gate electrode 124 on a substrate 110; a gate insulating film 140 on the gate electrode 124; a source electrode 173 and a drain electrode 175 on the gate insulating film 140; an organic semiconductor layer 154 on the source electrode 173 and the drain electrode 175; and a hydrophilic nanolayer 155 on the organic semiconductor layer 154.

The substrate 110 may be a support substrate supporting the organic thin film transistor 100, for example, a glass substrate, a polymer substrate, or a silicon wafer. The polymer substrate may include, for example, polyethylene terephthalate, polyethylene naphthalate, polycarbonate, polyacrylate, polyimide, or any combination thereof, but is not limited thereto.

For example, the substrate 110 may be a stretchable substrate that can be stretched in a predetermined direction and can be restored again. The stretchable substrate may flexibly respond to external forces or external movements such as twisting, pressing, and pulling in a predetermined direction. The stretchable substrate may include a stretchable material, and the stretchable material may include an organic elastomer, an organic-inorganic elastomer, an inorganic elastomer-like material, or any combination thereof. The organic elastomer or organic-inorganic elastomer may include, for example, a substituted or unsubstituted polyorganosiloxane such as polydimethylsiloxane, an elastomer including a substituted or unsubstituted butadiene moiety such as styrene-ethylene-butylene-styrene, an elastomer including a urethane moiety, an elastomer including an acrylic moiety, an elastomer including an olefin moiety, or any combination thereof, but is not limited thereto. The inorganic elastomer-like material may include a ceramic having elasticity, a solid metal, a liquid metal, or any combination thereof, but is not limited thereto.

The substrate 110 may have one layer or two or more layers made of different materials.

The gate electrode 124 is connected to a gate line (not shown) that transmits a gate signal. The gate electrode 124 may be made of, for example, gold (Au), copper (Cu), nickel (Ni), aluminum (Al), molybdenum (Mo), chromium (Cr), tantalum (Ta), titanium (Ti), an alloy thereof, or any combination thereof, but is not limited thereto. However, when the substrate 110 is a silicon wafer, the gate electrode 124 may be a doped region in the silicon wafer. The gate electrode 124 may have one layer or two or more layers.

The gate insulating film 140 may include an organic insulating material, an inorganic insulating material, an organic-inorganic insulating material, or any combination thereof. Examples of the organic insulating material may include a polyvinyl alcohol-based compound, a polyimide-based compound, a polyacryl-based compound, a polystyrene-based compound, benzocyclobutane (BCB), a polymer compound such as styrene-ethylene-butylene-styrene (SEBS); examples of the inorganic insulating material may include silicon nitride ($SiN_x$), silicon oxide ($SiO_2$), aluminum oxide ($Al_2O_3$), hafnium oxide ($HfO_2$), or any combination thereof; and examples of the organic-inorganic insulating material may include polyorganosiloxane, but the present inventive concepts are not limited thereto. The gate insulating film 140 may have one layer or two or more layers.

The source electrode 173 and the drain electrode 175 face the gate electrode 124. The source electrode 173 is connected to a data line (not shown) that transmits a data signal. The source electrode 173 and the drain electrode 175 may be made of gold (Au), copper (Cu), nickel (Ni), aluminum (Al), molybdenum (Mo), chromium (Cr), tantalum (Ta), titanium (Ti), an alloy thereof, or any combination thereof, but are not limited thereto.

The organic semiconductor layer 154 may include an organic semiconductor material. The organic semiconductor material may include a low molecular weight semiconductor material, a polymeric semiconductor material, or any combination thereof.

The low molecular weight semiconductor material may be, for example, an aromatic compound and/or a heteroaromatic compound, for example a fused polycyclic aromatic compound and/or a fused polycyclic heteroaromatic compound, for example for example a fused polycyclic aromatic compound such as pentacene and/or a fused polycyclic heteroaromatic compound including at least one O, S, Se, Te, N, or any combination thereof, for example a fused polycyclic heteroaromatic compound including at least one S, Se, Te, or any combination thereof. For example, the organic semiconductor material may be a fused polycyclic aromatic compound and/or fused polycyclic heteroaromatic compound having a compact planar structure in which three or more rings, for example a fused polycyclic aromatic compound and/or a fused polycyclic heteroaromatic compound in which 4, 5, 6, 7, 8, 9, 10, 11, or 12 rings are fused to each other.

The polymeric semiconductor material may include, for example, structural units including at least one electron donating moiety and at least one electron accepting moiety.

The electron donating moiety may include, for example, one or more substituted or unsubstituted arylene groups; one or more substituted or unsubstituted heterocyclic groups; or a fused ring thereof. The electron donating moiety may include, for example, one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted pentagonal rings including at least one of N, O, S, Se, Te, or Si; a fused ring of two or more of the substituted or unsubstituted pentagonal rings; a fused ring of at least one substituted or unsubstituted pentagonal rings and at least one substituted or unsubstituted phenylene group; a fused ring of at least one substituted or unsubstituted pentagonal ring and at least one substituted or unsubstituted naphthylene group; a fused ring of at least one substituted or unsubstituted pentagonal ring and at least one substituted or unsubstituted anthracenylene group; a fused ring of at least one substituted or unsubstituted pentagonal ring and at least one substituted or unsubstituted phenanthrenylene group; or any combination thereof, but is not limited thereto. The electron donating moiety may be, for example, one of the moieties listed in Group 1, but is not limited thereto.

[Group 1]

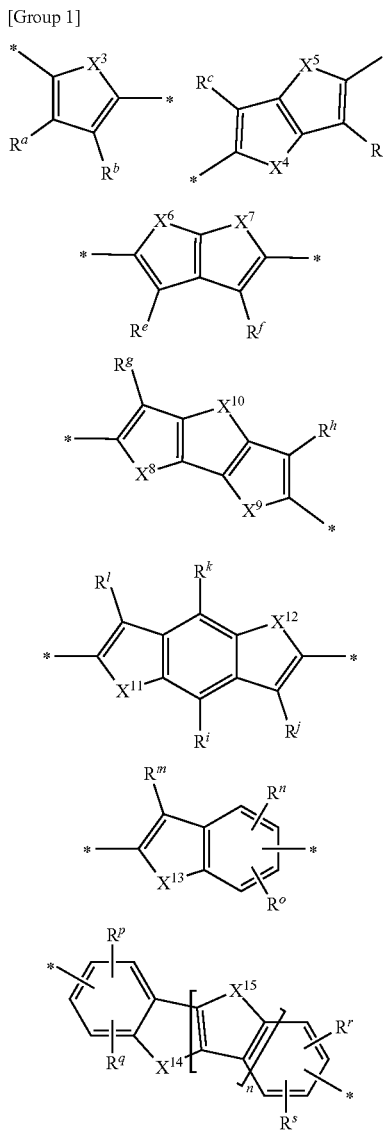

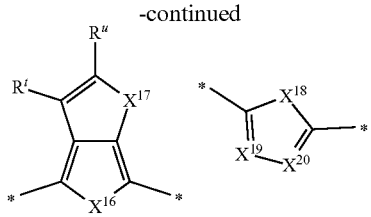

In Group 1, $X^3$ to $X^9$ and $X^{11}$ to $X^{18}$ are each independently O, S, Se, or Te, $X^{10}$ is O, S, Se, Te, $NR^v$, $CR^wR^x$, or $SiR^yR^z$, $X^{19}$ and $X^{20}$ are $NR^v$, $CR^wR^x$, or $SiR^yR^z$, $R^a$ to $R^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or any combination thereof, n is 0, 1, or 2, and

* is a linking point of the polymer backbone.

The electron accepting moiety may be, for example, represented by Chemical Formula A, but is not limited thereto.

[Chemical Formula A]

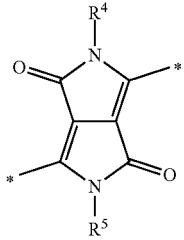

In Chemical Formula A, $R^4$ and $R^5$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —$COR^d$, —$OCOR^e$, —$COOR^f$, —$OCOOR^g$, a halogen, a cyano group, or any combination thereof, $R^d$ to $R^g$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or any combination thereof, and

* may be a linking point of the polymer backbone.

The electron donating moiety and the electron accepting moiety may be directly bonded or linked by a linking group.

The linking group may be, for example, a divalent linking group including at least one substituted or unsubstituted furan; at least one substituted or unsubstituted thiophene; at least one substituted or unsubstituted selenophene; at least one substituted or unsubstituted telluropene; at least one substituted or unsubstituted pyrrole; at least one substituted or unsubstituted benzene; at least one substituted or unsubstituted pyridine; at least one substituted or unsubstituted pyrimidine; or a fused ring in which two or more selected from these; or any combination thereof, but are not limited thereto.

A weight average molecular weight of the polymeric semiconductor material may be about 5,000 Da to about 500,000 Da, and within the above range, about 10,000 Da to about 300,000 Da, or about 30,000 Da to about 200,000 Da.

The organic semiconductor layer 154 may further include an elastomer. The elastomer may provide stretchability to the organic semiconductor layer 154. The elastomer may be, for example, polydimethylsiloxane (PDMS), styrene-ethylene-butylene-styrene (SEBS), styrene-ethylene-propylene-styrene (SEPS), styrene-butadiene-styrene (SBS), styrene-isoprene-styrene (SIS), styrene-isobutylene-styrene (SIBS), or any combination thereof, but is limited thereto. As described above, the organic semiconductor layer 154 may include an elastomer to implement a stretchable organic semiconductor layer.

The organic semiconductor layer 154 may be hydrophobic. The surface of the organic semiconductor layer 154 may be hydrophobic. For example, a contact angle of the organic semiconductor layer 154 with respect to water may be about 65 degrees to about 150 degrees, within the above range, about 70 degrees to about 140 degrees, about 80 degrees to about 130 degrees, or about 90 degrees to about 120 degrees. Herein, the contact angle may be measured by dropping a small amount of pure water on the organic semiconductor layer 154 and measuring the angle between the water droplet and the substrate.

The hydrophilic nanolayer 155 may be on the organic semiconductor layer 154 and may be in direct contact with (e.g., may cover) at least a portion of, or all of, an upper surface of the organic semiconductor layer 154. The hydrophilic nanolayer 155 may be a very thin film with a thickness of several nanometers, and may have a thickness of, for example, less than about 10 nm, less than or equal to about 8 nm, less than or equal to about 6 nm, less than or equal to about 5 nm, or less than or equal to about 3 nm, for example, greater than or equal to about 1 nm and less than about 10 nm, about 1 nm to about 8 nm, about 1 nm to about 6 nm, about 1 nm to about 5 nm, or about 1 nm to about 3 nm.

As an example, the hydrophilic nanolayer 155 may be on (e.g., may cover) all or a portion of the upper surface of the organic semiconductor layer 154, and may include, for example, a plurality of island-shaped patterns of dots or polygonal shapes, or a plurality of linear patterns extending in one direction, or may be a continuous layer with a plurality of holes. As described above, since the hydrophilic nanolayer 155 is on a portion of the upper surface of the organic semiconductor layer 154, stretching of the stretchable organic semiconductor layer may not be prevented when the organic semiconductor layer 154 is a stretchable organic semiconductor layer.

The hydrophilic nanolayer 155 may have a hydrophilic surface characteristic, unlike the organic semiconductor layer 154 described above, and a contact angle of the hydrophilic nanolayer 155 with respect to water may be greater than or equal to about 0 degrees and less than about 65 degrees, within the above range, about 2 degrees to about 60 degrees, about 2 degrees to about 50 degrees, about 5 degrees to about 40 degrees, or about 5 degrees to about 30 degrees.

The hydrophilic nanolayer 155 may serve as an auxiliary layer to help a formation of a protective interlayer 160 formed to protect the organic semiconductor layer 154 during a process, as will be described later. Specifically, the protective interlayer 160a to be described later may be formed from an aqueous solution containing a water-soluble compound, and the aqueous solution is difficult to be effectively coated on the organic semiconductor layer 154 with a hydrophobic surface. The hydrophilic nanolayer 155 may be an auxiliary layer that helps effective coating of the aqueous solution for the protective interlayer 160 on the organic semiconductor layer 154. According to the hydrophilic property of the hydrophilic nanolayer 155, the protective interlayer 160 may be effectively coated on the organic semiconductor layer 154.

The hydrophilic nanolayer 155 may include, for example, a hydrophilic inorganic material, a hydrophilic organic material, a hydrophilic organic-inorganic material, or any combination thereof. The hydrophilic inorganic material may include, for example, a metal oxide, a semi-metal oxide, or any combination thereof. The hydrophilic organic material may include, for example, a low molecular weight compound having a hydrophilic functional group (e.g., molecular weight of less than or equal to about 3,000), and the hydrophilic organic-inorganic material may include, for example, a composite of a low molecular weight compound with a hydrophilic functional group and inorganic particles, but is not limited thereto.

The hydrophilic inorganic material, the hydrophilic organic material, and the hydrophilic organic-inorganic material may be insoluble in water while having the aforementioned surface characteristics, and thus may have process selectivity with the protective interlayer 160a to be described later. The hydrophilic inorganic material, the hydrophilic organic material, and the hydrophilic organic-inorganic material may each be electrical insulators, and thus may not affect the electrical characteristics of the organic thin film transistor 100.

For example, the hydrophilic nanolayer 155 may include a metal oxide, a semi-metal oxide, or any combination thereof. The metal oxide and/or semi-metal oxides may include, for example, aluminum oxide, hafnium oxide, magnesium oxide, silicon oxide, molybdenum oxide, tungsten oxide, rhenium oxide, niobium oxide, tantalum oxide, titanium oxide, nickel oxide, copper oxide, cobalt oxide, manganese oxide, chromium oxide, or any combination thereof, but are not limited thereto.

As described above, the organic thin film transistor 100 according to some example embodiments includes the hydrophilic nanolayer 155 of a very thin thickness on the organic semiconductor layer 154, thereby effectively applying the hydrophilic solution for the protective interlayer 160a used during the process. As will be described later, the protective interlayer 160a may protect the organic semiconductor layer 154 from a chemical liquid used during the process, and thus ultimately prevent the deterioration of the organic semiconductor layer 154 and the organic thin film transistor 100 including the same.

Next, an organic thin film transistor 100 according to another example is described with reference to FIG. 2.

Figure 2:
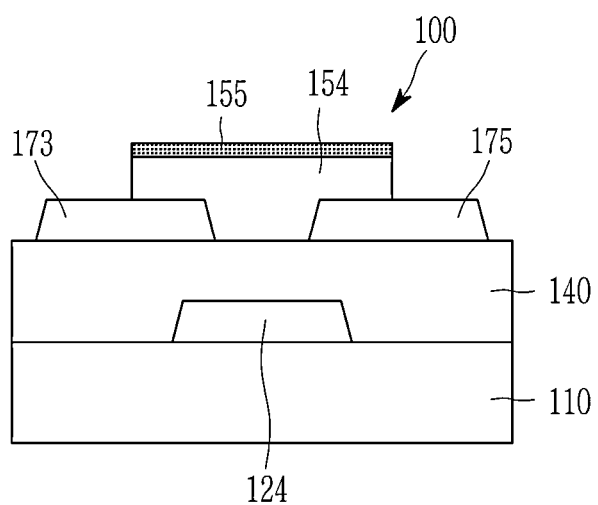

Referring to FIG. 2, the organic thin film transistor 100 according to an example may be an organic thin film transistor having a bottom gate structure and a bottom contact structure, like the aforementioned example. That is, like the organic thin film transistor 100 according to the aforementioned example, it includes a gate electrode 124 on the substrate 110; a gate insulating film 140 on the gate electrode 124; a source electrode 173 and a drain electrode 175 on the gate insulating film 140; an organic semiconductor layer 154 on the source electrode 173 and the drain electrode 175; and a hydrophilic nanolayer 155 on the organic semiconductor layer 154. The description of the substrate 110, the gate electrode 124, the source electrode 173, the drain electrode 175, the organic semiconductor layer 154, and the hydrophilic nanolayer 155 is the same as described above.

However, in the organic thin film transistor 100 according to the present example, the hydrophilic nanolayer 155 is formed on the whole of the upper surface of the organic semiconductor layer 154, unlike the aforementioned example. Since the hydrophilic nanolayer 155 is formed on the whole of the organic semiconductor layer 154, the protective interlayer 160*a* may be more uniformly coated on the organic semiconductor layer 154 as described later, and thus damage of the organic semiconductor layer 154 may be prevented more effectively.

Next, an organic thin film transistor 100 according to another example is described with reference to FIGS. 3 and 4. Unlike the aforementioned example, the organic thin film transistor 100 according to the present example may be an organic thin film transistor having a bottom gate structure and a top contact structure.

Figure 3:
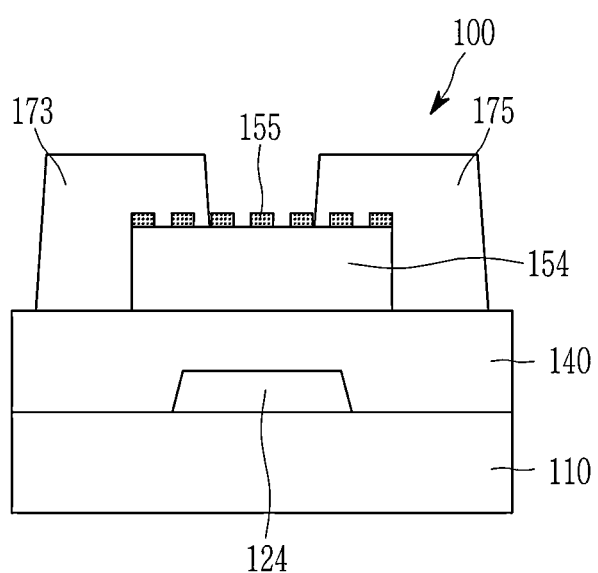
Figure 4:
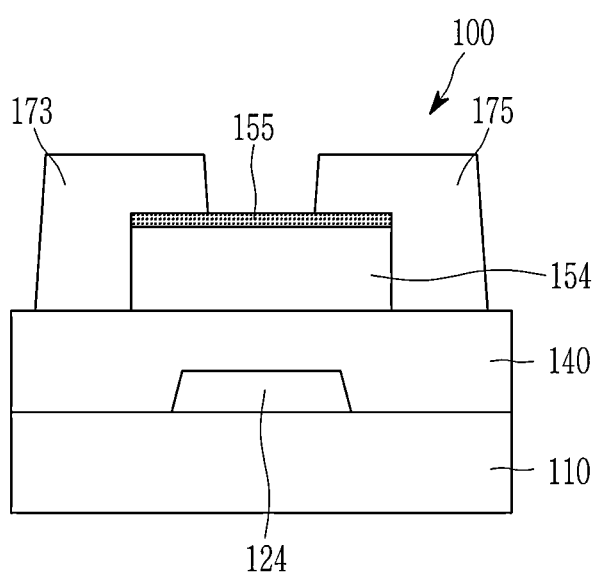

Referring to FIGS. 3 and 4, the organic thin film transistor 100 according to the present example includes a gate electrode 124 on a substrate 110; a gate insulating film 140 on the gate electrode 124; an organic semiconductor layer 154 on the gate insulating film 140; a hydrophilic nanolayer 155 on the organic semiconductor layer 154; and a source electrode 173 and a drain electrode 175 on the organic semiconductor layer 154. The descriptions of the substrate 110, the gate electrode 124, the source electrode 173, the drain electrode 175, the organic semiconductor layer 154, and the hydrophilic nanolayer 155 are the same as described above.

Unlike the organic thin film transistor 100 shown in FIG. 3, in the organic thin film transistor 100 shown in FIG. 4, the hydrophilic nanolayer 155 may be formed on the whole of the upper surface of the organic semiconductor layer 154. As the hydrophilic nanolayer 155 is formed on the whole of the upper surface of the organic semiconductor layer 154, the protective interlayer 160*a* may be more uniformly coated on the organic semiconductor layer 154 as described later, and thus damage of the organic semiconductor layer 154 may be prevented more effectively.

Next, an organic thin film transistor 100 according to another example is described with reference to FIGS. 5 and 6. Unlike the aforementioned example, the organic thin film transistor 100 according to the present example may be an organic thin film transistor having a top gate structure and a bottom contact structure.

Figure 5:
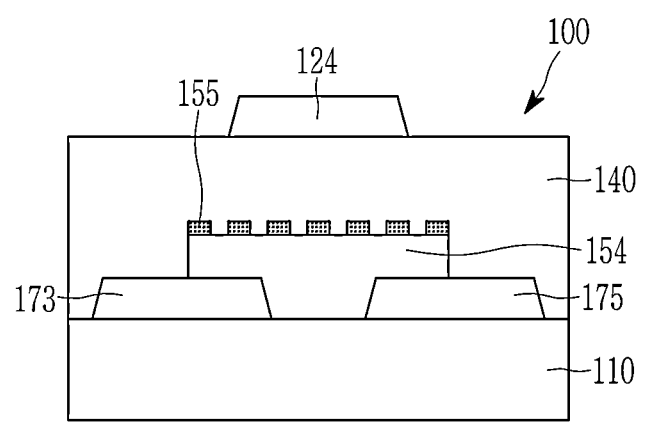
Figure 6:
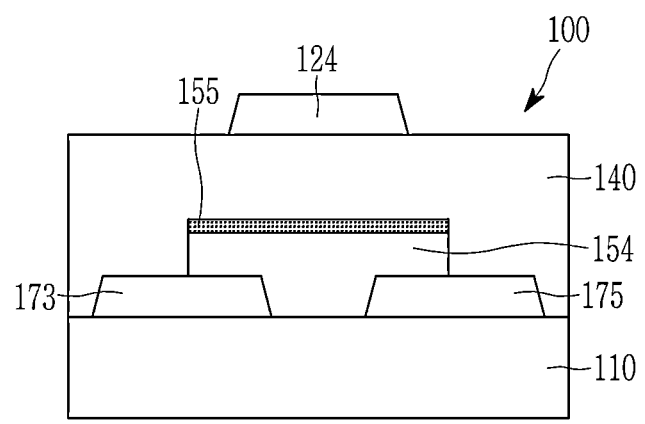

Referring to FIGS. 5 and 6, the organic thin film transistor 100 according to an example includes a source electrode 173 and a drain electrode 175 on a substrate 110; an organic semiconductor layer 154 on the source electrode 173 and the drain electrode 175; a hydrophilic nanolayer 155 on the organic semiconductor layer 154; a gate insulating film 140 on the organic semiconductor layer 154; and a gate electrode 124 on the gate insulating film 140. The descriptions of the substrate 110, the source electrode 173, the drain electrode 175, the organic semiconductor layer 154, the hydrophilic nanolayer 155, the gate insulating film 140, and the gate electrode 124 are the same as described above.

Unlike the organic thin film transistor 100 illustrated in FIG. 5, in the organic thin film transistor 100 illustrated in FIG. 6, the hydrophilic nanolayer 155 may be formed on the whole of the upper surface of the organic semiconductor layer 154. Since the hydrophilic nanolayer 155 is formed on the whole of the upper surface of the organic semiconductor layer 154, the protective interlayer 160*a* may be more uniformly coated on the organic semiconductor layer 154 as described later, and thus damage of the organic semiconductor layer 154 may be prevented more effectively.

Next, an organic thin film transistor 100 according to another example is described with reference to FIGS. 7 and 8. Unlike the aforementioned example, the organic thin film transistor 100 according to the present example may be an organic thin film transistor having a top gate structure and a top contact structure.

Figure 7:
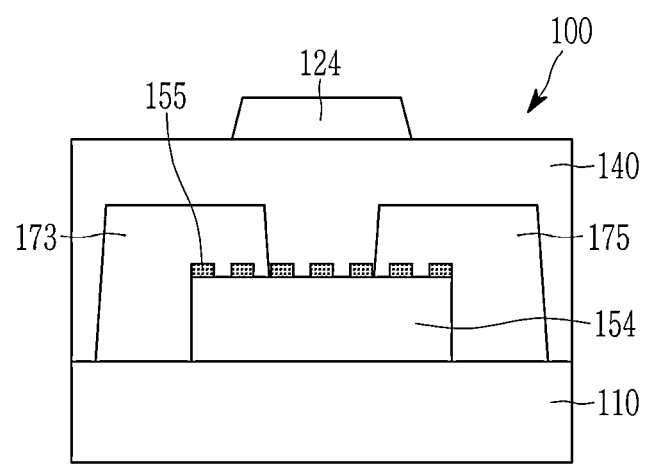
Figure 8:
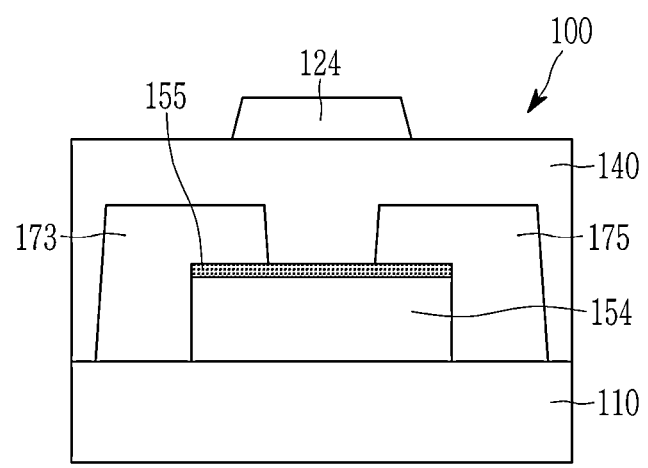

Referring to FIGS. 7 and 8, the organic thin film transistor 100 according to an example includes an organic semiconductor layer 154 on a substrate 110; a hydrophilic nanolayer 155 on the organic semiconductor layer 154; a source electrode 173 and a drain electrode 175 on the organic semiconductor layer 154; a gate insulating film 140 on the source electrode 173 and the drain electrode 175; and a gate electrode 124 on the gate insulating film 140. The substrate 110, the organic semiconductor layer 154, the hydrophilic nanolayer 155, the source electrode 173, the drain electrode 175, the gate insulating film 140, and the gate electrode 124 are as described above.

Unlike the organic thin film transistor 100 illustrated in FIG. 7, in the organic thin film transistor 100 illustrated in FIG. 8, the hydrophilic nanolayer 155 may be formed on the whole of the upper surface of the organic semiconductor layer 154. As the hydrophilic nanolayer 155 is formed on the whole of the upper surface of the organic semiconductor layer 154, the protective interlayer 160*a* may be more uniformly coated on the organic semiconductor layer 154 as described later, and thus damage of the organic semiconductor layer 154 may be prevented more effectively.

Herein, examples of the organic thin film transistor 100 have been described, but the present inventive concepts are not limited thereto and may be equally applied to organic thin film transistors of all structures including organic semiconductors.

The organic thin film transistor 100 may be included in the thin film transistor array panel.

Figure 19:
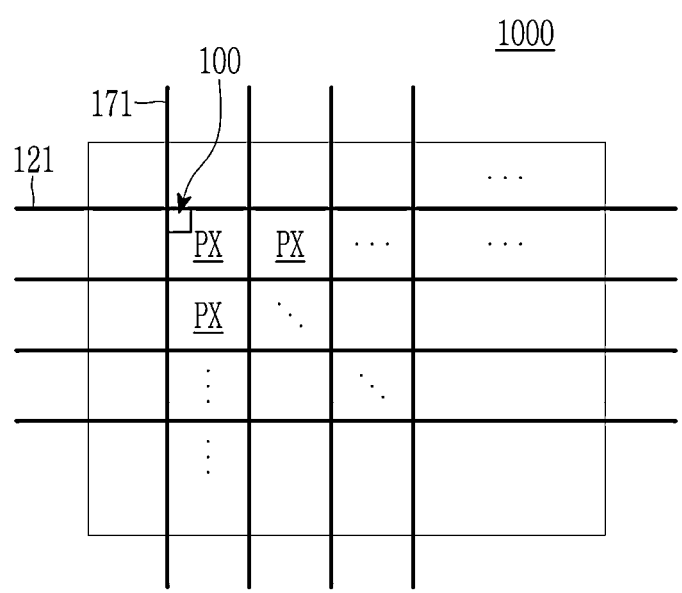
FIG. 19 is a schematic plan view of a thin film transistor array panel according to some example embodiments.

FIG. 19 is a schematic plan view of a thin film transistor array panel according to some example embodiments.

Referring to FIG. 19, the thin film transistor array panel 1000 according to some example embodiments includes a plurality of subpixels PXs defined by a plurality of gate lines 121 and a plurality of data lines 171 and the plurality of subpixels PX may be arranged in a matrix form along rows and/or columns. Each subpixel PX may include one or more organic thin film transistors 100 as switching and/or driving devices. The organic thin film transistors 100 may be regularly arranged along rows and/or columns in the thin film transistor array panel 1000.

The aforementioned organic thin film transistor 100 and/or thin film transistor array panel 1000 may be applied to various electronic devices, for example, a display device such as a liquid crystal display device, an organic light emitting diode display device, or a quantum dot display device; and a sensor device such as an optical sensor or a biosensor, but the present inventive concepts are not limited thereto.

The electronic device may be, for example, mobile phones, video phones, smart phones, mobile phones, smart pads, smart watches, digital cameras, tablet PCs, laptop PCs, notebook computers, computer monitors, wearable computers, televisions, digital broadcasting terminals, e-books, personal digital assistants (PDAs), portable multimedia player (PMP), enterprise digital assistant (EDA), head mounted display (HMD), vehicle navigation, Internet of Things (IoT), Internet of all things (IoE), drones, door locks, safes, automatic teller machines (ATM), security devices, medical devices, or automotive electronic components, but is not limited thereto. For example, the electronic device may be a flexible electronic device or a stretchable electronic device, and may be a wearable device and/or a skin type device.

Hereinafter, an example of a method of manufacturing the aforementioned organic thin film transistor 100 is described with reference to the drawings.

FIGS. 9, 10, 11, 12, 13, 14, 15, 16, 17, and 18 are cross-sectional views sequentially illustrating an example of a method of manufacturing an organic thin film transistor according to some example embodiments.

Figure 9:
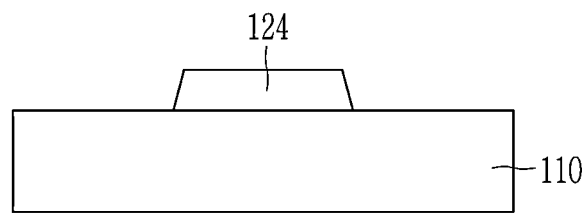
FIGS. 9, 10, 11, 12, 13, 14, 15, 16, 17, and 18 are cross-sectional views sequentially showing an example of a method of manufacturing an organic thin film transistor according to some example embodiments.

First, referring to FIG. 9, a conductive layer (not shown) is formed on the substrate 110 and then patterned it by photolithography to form a gate electrode 124.

Figure 10:
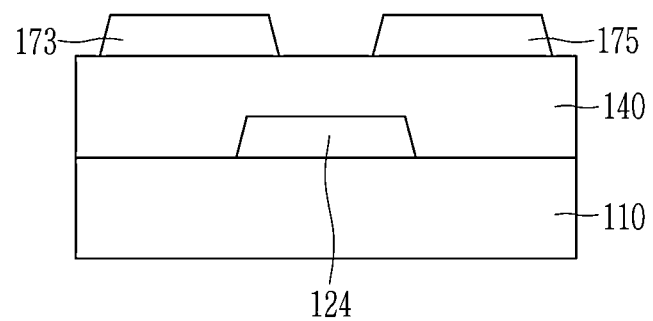

Next, referring to FIG. 10, the gate insulating film 140 is formed on the whole surface of the substrate 110 including the gate electrode 124. The gate insulating film 140 may be formed of, for example, silicon oxide ($SiO_2$), silicon nitride ($SiN_x$), aluminum oxide ($Al_2O_3$), or an organic insulator by, for example, a vapor deposition or a solution process. The vapor deposition may be, for example, chemical vapor deposition, vacuum deposition, thermal deposition, or laser deposition and the solution process may be spin coating, screen printing, printing, imprinting, spin casting, dipping, roll coating, drop casting, spray coating, roll printing, slit coating, or inkjet printing, but the present inventive concepts are not limited thereto.

Next, a conductive layer (not shown) for source and drain electrodes is formed on the gate insulating film 140 and then patterned it by photolithography to form a source electrode 173 and a drain electrode 175. Alternatively, the source electrode 173 and the drain electrode 175 may be formed using a metal mask on the gate insulating film 140.

Figure 11:
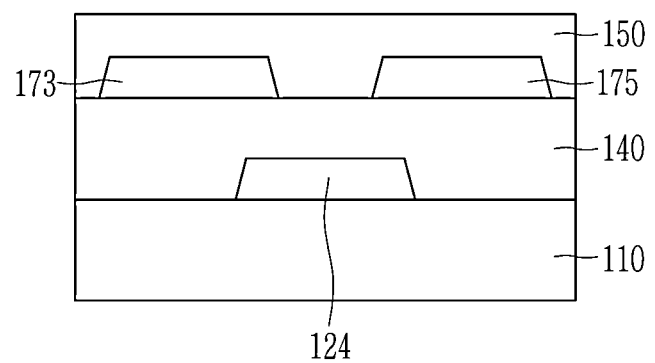

Next, referring to FIG. 11, the organic semiconductor thin film 150 is formed on the source electrode 173 and the drain electrode 175. The organic semiconductor thin film 150 may be formed on the whole surface of the substrate 110, for example, by a vapor deposition or a solution process. For example, the organic semiconductor thin film 150 may be formed by coating an organic semiconductor solution prepared by dissolving a low-molecular weight semiconductor, a polymeric semiconductor, or any combination thereof in a solvent through a solution process. The solution process may be, for example, spin coating, slit coating, inkjet coating, drop casting, spraying, dipping, or any combination thereof, but is not limited thereto.

After the solution process, drying and optionally annealing may be performed. The annealing may be performed, for example, at about 30° C. to about 200° C. for about 1 minute to about 10 hours, but is not limited thereto.

Figure 12:
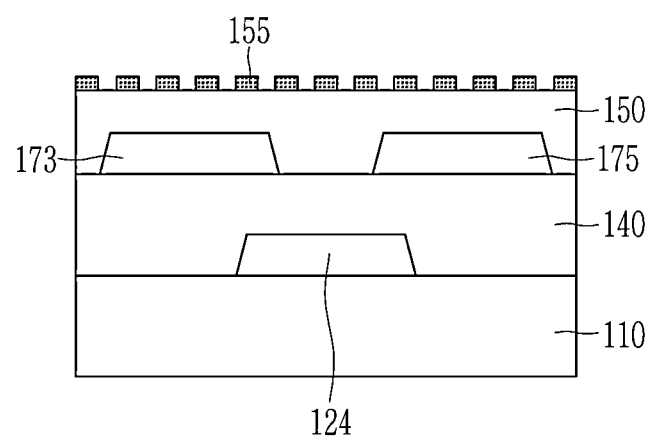

Referring to FIG. 12, a hydrophilic nanolayer 155 is formed on the organic semiconductor thin film 150. The hydrophilic nanolayer 155 may be formed to have a very thin thickness of several nanometers, and may be formed by, for example, a deposition method such as resistance heating deposition, ion beam deposition, or atomic layer deposition or sputtering of an inorganic material, an organic material, an organic-inorganic material, or any combination thereof. For example, the hydrophilic nanolayer 155 may be formed of a metal, a metalloid, a metal oxide, a semi-metal oxide, or any combination thereof by vapor deposition such as atomic layer deposition or sputtering. For example, vapor deposition or sputtering such as atomic layer deposition may be performed at a relatively low temperature at which the organic semiconductor thin film 150 is not deteriorated, and may be, for example, performed at about 30° C. to about 150° C., but is not limited thereto. For example, the sputtering may be performed as low-damage sputtering with little damage to an organic material, but is not limited thereto. The hydrophilic nanolayer 155 may be formed on the whole surface or a portion of the organic semiconductor thin film 150, and when only a portion is formed, for example, a metal mask may be used to form the hydrophilic nanolayer 155.

Figure 13:
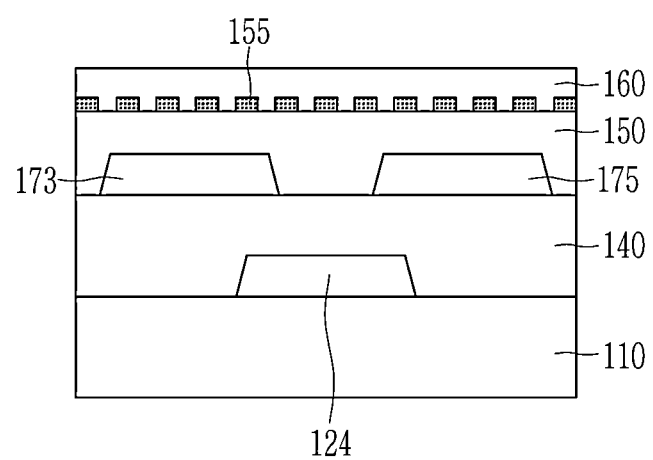

Next, referring to FIG. 13, a protective interlayer 160 is formed on the organic semiconductor thin film 150 on which the hydrophilic nanolayer 155 is formed (e.g., the protective interlayer 160 may be formed on the hydrophilic nanolayer 155). The protective interlayer 160 is to protect the organic semiconductor thin film 150 in a subsequent photolithography process, for example, prevent a chemical liquid used in a subsequent lithography process from directly flowing into the organic semiconductor thin film 150. The protective interlayer 160 may be formed to a relatively thick thickness, and may be formed to a thickness of greater than or equal to about 100 nm, greater than or equal to about 200 nm, greater than or equal to about 300 nm, greater than or equal to about 500 nm, greater than or equal to about 800 nm, or greater than or equal to about 1 μm, within the above range, about 100 nm to about 10 μm, about 200 nm to about 10 μm, about 300 nm to about 10 μm, about 500 nm to about 10 μm, about 800 nm to about 10 μm, or about 1 μm to about 10 μm.

The protective interlayer 160 may include a material different from that of the hydrophilic nanolayer 155, such that the protective interlayer 160 and the hydrophilic nanolayer 155 may have different total material compositions. The protective interlayer 160 may be formed by, for example, coating an aqueous solution containing a water-soluble compound (hereinafter referred to as "aqueous solution for protective interlayer") by a solution process. The water-soluble compound may be formed by, for example, coating an aqueous solution prepared by dissolving a water-soluble polymeric compound, a water-soluble low molecular weight compound, or any combination thereof in water, and the water-soluble polymeric compound and/or the water-soluble low molecular weight compound may include one or more hydrophilic functional groups. The water-soluble compound may include, for example, poly(ethylene) glycol (PEG), polyvinyl pyrrolidone (PVP), polyvinyl alcohol (PVA), polyacrylic acid (PAA), polyacrylamide, N-(2-hydroxypropyl) methacrylamide, polyoxazoline, polyphosphate, polyphosphazene, xanthan gum, pectin, chitosan, dextran, carrageenan, guar gum, a cellulose ether, a derivative thereof, or any combination thereof, but is not limited thereto. The solution process may be, for example, spin coating, slit coating, inkjet coating, drop casting, spraying, dipping, or any combination thereof, but is not limited thereto.

As described above, the hydrophilic nanolayer 155 may serve as an auxiliary layer helping the effective coating of the aqueous solution for the protective interlayer 160 on the organic semiconductor layer 154, and thus an aqueous solution for the protective interlayer 160 may be effectively coated on the organic semiconductor thin film 150 having a hydrophobic surface.

After coating of the aqueous solution for the protective interlayer 160, drying and optionally annealing may be performed. The annealing may be performed, for example, at about 30° C. to about 150° C. for about 1 minute to about 10 hours, but the present inventive concepts are not limited thereto.

Figure 14:
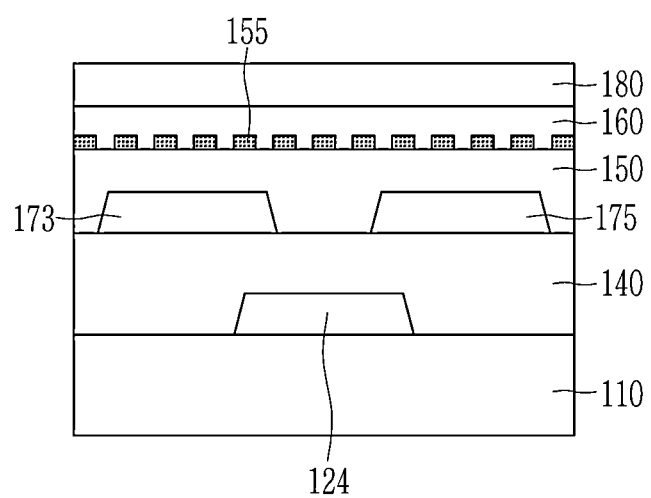

Next, referring to FIG. 14, a photoresist film 180 is formed on the protective interlayer 160. The photoresist film 180 may be formed by coating a photoresist solution including a photosensitive material, and may be, for example, a negative photoresist film or a positive photoresist film. The photoresist solution may include, for example, a fluorine-containing photoresist, a photoacid generator, and a solvent, and thus the photoresist film 180 may include a fluorine-containing photoresist. The fluorine-containing photoresist may implement fine patterning without damaging the organic semiconductor thin film 150.

Figure 15:
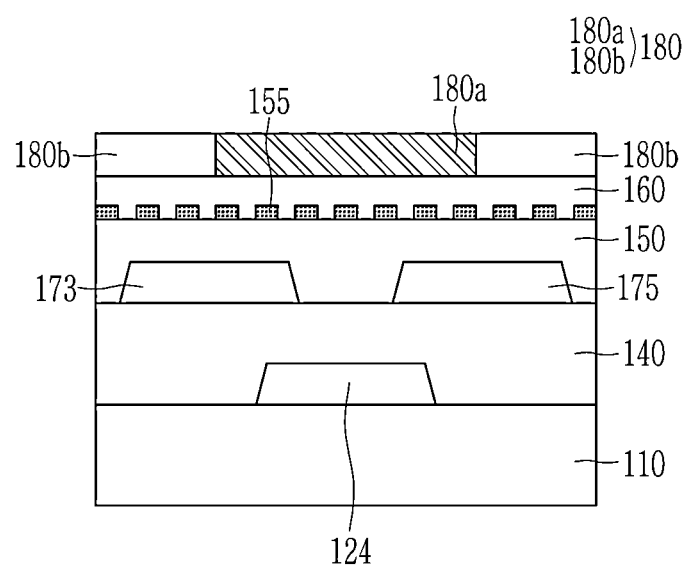

Next, referring to FIG. 15, a mask (not shown) is disposed on the photoresist film 180 and exposure is performed. The mask may include a light transmitting portion and a light blocking portion, and the light transmitting portion may be disposed at a position corresponding to the region where the photoresist pattern 180a is to be formed. Then, a predetermined region of the photoresist film 180 is selectively exposed and cured by, for example, negative photolithography by irradiating light such as UV, for example, on the mask. Accordingly, the photoresist film 180 may include a photoresist pattern 180a polymerized by exposure and an unexposed portion 180b.

In this exposure process, various components included in the photoresist film 180 may diffuse downward, and for example, a material such as a photoacid generator included in the photoresist film 180 may flow into the protective interlayer 160.

If there is no protective interlayer 160, the material diffused downward from the photoresist film 180 in the exposure process may directly flow into the organic semiconductor thin film 150, and thus, deterioration of electrical characteristics such as a significant change in threshold voltage (Vth) of the organic thin film transistor 100 may be caused. Since the protective interlayer 160 is a sacrificial layer removed during the process as described later, even if a material such as a photoacid generator is introduced during exposure, the electrical characteristics of the organic thin film transistor 100 may not be affected.

Figure 16:
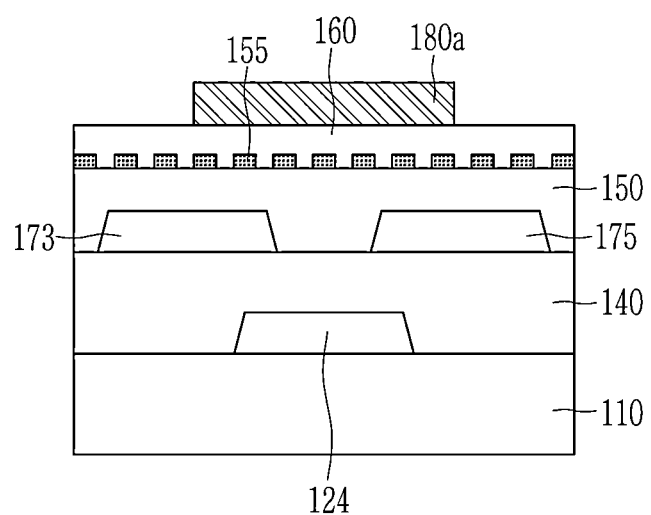

Next, referring to FIG. 16, the unexposed portion 180b of the photoresist film 180 is removed by development, leaving only the photoresist pattern 180a.

Figure 17:
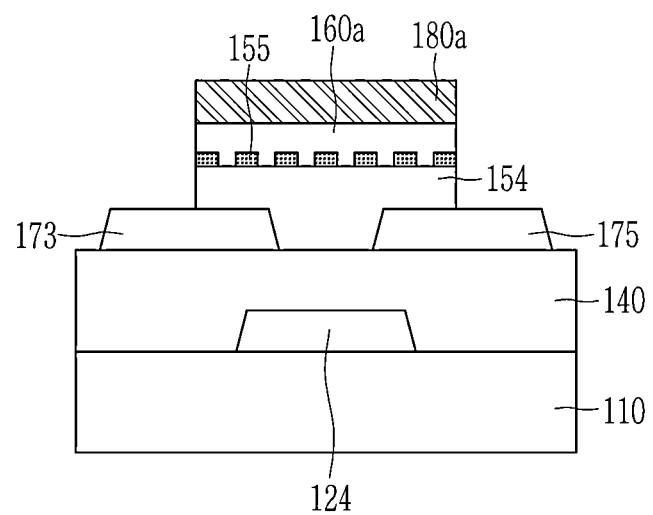

Next, referring to FIG. 17, the protective interlayer 160, the hydrophilic nanolayer 155 and the organic semiconductor thin film 150 are etched using the photoresist pattern 180a as a mask. The etching may be dry etching or wet etching. The protective interlayer 160 may be patterned by etching to form the protective interlayer 160a, and the organic semiconductor thin film 150 may be patterned to form the organic semiconductor layer 154.

Figure 18:
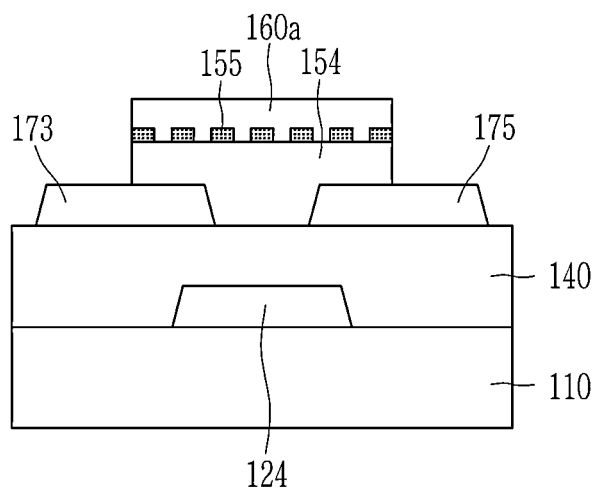

Next, referring to FIG. 18, the photoresist pattern 180a is removed by stripping, and the patterned protective interlayer 160a is exposed.

Next, referring to FIG. 1, the protective interlayer 160a is removed by supplying water. Since the protective interlayer 160a includes a water-soluble compound as described above, it may be easily removed by dissolving in water, and the hydrophilic nanolayer 155 is not removed because it includes a material insoluble in water as described above. The operations shown in FIGS. 14-18 and 1 may be considered to be included in a photolithography process (e.g., a photolithography) that may be performed on at least the protective interlayer 160/160a, the hydrophilic nanolayer 155, and the organic semiconductor thin film 154 (restated, a photolithography of at least the protective interlayer 160/160a, the hydrophilic nanolayer 155, and the organic semiconductor thin film 154 may be performed). Accordingly, it will be understood that, referring to FIGS. 13-18 and 1, a photolithography of at least the protective interlayer 160/160a, the hydrophilic nanolayer 155, and the organic semiconductor thin film 154 may be performed, and then the protective interlayer 160a may be removed subsequently to performing the photolithography.

As described above, by forming the protective interlayer 160 as a sacrificial layer in the forming of the organic semiconductor layer 154, materials moving downward from the photoresist film in the photo-etching process (e.g., photolithography process) are prevented from being directly introduced into the organic semiconductor thin film 150, and thus deterioration of the electrical performance of the organic thin film transistor 100 may be effectively prevented. In addition, before forming the protective interlayer 160, an aqueous solution for the protective interlayer 160 may be effectively coated on the organic semiconductor thin film 150 by forming a very thin hydrophilic nanolayer 155 on the upper surface of the organic semiconductor thin film 150, and thus, deterioration of the electrical performance of the aforementioned organic thin film transistor 100 may be more effectively prevented.

In the above, an example of the method of manufacturing the organic thin film transistor 100 shown in FIG. 1 has been described, but the organic thin film transistor 100 shown in FIGS. 2 to 8 is also manufactured substantially by the same manner except in a different order of each layer.

Hereinafter, some example embodiments are illustrated in more detail with reference to examples. However, the present scope of the inventive concepts is not limited to these examples.

EXAMPLES

Example 1

On a glass substrate coated with a sacrificial layer, a styrene-ethylene-butylene-styrene (SEBS) solution obtained by dissolving SEBS and a curing agent in toluene is coated, dried, and photocured to form a stretchable substrate (elongation rate: 700%, elastic modulus: about 1 MPa).

Then, Au is formed by a resistance heating deposition on the stretchable substrate to form a gate electrode, and then a SEBS solution containing a curing agent is coated on the gate electrode, photocured, and annealed at 120° C. for 0.5 hours to form a gate insulating film. Then, Au is formed by a resistance heating deposition on the gate insulating film to form a source electrode and a drain electrode. Then, an organic semiconductor solution in which DPP-TT (poly(2,5-bis(2-octyldodecyl)-3,6-di(thiophen-2-yl)diketopyrrolo[3,4-c]pyrrole-1,4-dione-altthieno[3,2-b]thiophen)) and SEBS are blended in chlorobenzene in a weight ratio of 4:6 at a concentration of 0.6 wt % is spin-coated on the source electrode and the drain electrode at 1000 rpm to a thickness of 1000 Å, and heat-treated at 120° C. for 1.5 hours under a nitrogen atmosphere to form an organic semiconductor thin film.

Subsequently, Al is formed by resistance heating deposition on the organic semiconductor thin film and then oxidized in air to form a 2 nm-thick hydrophilic nanolayer including aluminum oxide. Then, a 10 vol % aqueous solution of Dextran (Aldrich) is coated on the organic semiconductor thin film on which the hydrophilic nanolayer is formed and dried to form a 300 nm-thick protective interlayer. Then, a fluorine-based photoresist is coated on the protective interlayer and patterned it by a photolithography to form a fluorine-based photoresist pattern, and the protective interlayer and the organic semiconductor thin film are patterned using the fluorine-based photoresist pattern as a mask to form a patterned protective interlayer and a patterned organic semiconductor layer. The fluorine-based photoresist pattern is removed by peeling it off with an isopropyl alcohol-containing fluorine-based solvent (Novec™, 3M) for 7 minutes, and then spin-coating water on the patterned protective interlayer to dissolve and remove the protective interlayer to manufacture an organic thin film transistor.

The channel width (W) and channel length (L) of the organic thin film transistor are 1000 µm and 100 µm, respectively.

Comparative Example 1

An organic thin film transistor is manufactured in the same manner as in Example 1, except that the hydrophilic nanolayer and the protective interlayer are not formed.

Comparative Example 2

An organic thin film transistor is manufactured in the same manner as in Example 1, except that the fluorine-based photoresist is peeled for 21 minutes (three times the peeling time compared to Example 1) without forming the hydrophilic nanolayer and the protective interlayer.

Comparative Example 3

An attempt has been made to coat the protective interlayer on the organic semiconductor thin film without forming a hydrophilic nanolayer, but the coating has been failed.

Evaluation

The electrical characteristics of the organic thin film transistors according to Examples and Comparative Examples are evaluated.

Electrical characteristics are evaluated from the current value ($I_{SD}$) flowing between the source electrode and the drain electrode when a voltage in the range of 20 V to −20 V is applied between the gate electrode and the source electrode under the condition of the voltage applied to the source electrode and the drain electrode of 20 V.

Electrical characteristics are evaluated from the amount of a change or a variation ratio by measuring the reference value (Ref.) before forming the hydrophilic nanolayer and measuring again in the same way after the process is completed.

The charge mobility of the thin film transistor is obtained from the slope of a graph using $(I_{SD})^{1/2}$ and $V_G$ as variables from the saturation region current equation:

$$I_{SD} = \frac{WC_0}{2L}\mu(V_G V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET}(\text{slope})^2 \frac{2L}{C_0 W}$$

wherein $I_{SD}$ is the source-drain current, $\mu$ or $\mu_{FET}$ is the charge mobility, $C_0$ is a capacitance of the gate insulating film, W is a channel width, L is a channel length, $V_G$ is a gate voltage, and $V_T$ is a threshold voltage. Herein, the voltage at which a straight line extrapolated from the maximum slope region of the $(I_{SD})^{1/2}$-$V_G$ graph intersects the $V_G$ axis is $V_T$.

The results are shown in Table 1.

TABLE 1

| | Change of threshold voltage (V) | Variation ratio of charge mobility (%) |
|---|---|---|
| Example 1 | +0.72 | −3 |
| Comparative Example 1 | +11.66 | +1 |
| Comparative Example 2 | +0.78 | −32 |

* Change of threshold voltage: Change of threshold voltage relative to Ref. after the process is completed.
* Variation ratio of charge mobility: Variation ratio of charge mobility relative to Ref. after the process is completed.

Referring to Table 1, the organic thin film transistor according to Example does not exhibit a significant change in electrical characteristics before and after the process, whereas the organic thin film transistors according to Comparative Examples exhibit significantly deteriorated electrical characteristics.

While the inventive concepts been described in connection with what is presently considered to be practical example embodiments, it is to be understood that the inventive concepts are not limited to these example embodiments. On the contrary, the inventive concepts are intended to cover various modifications and equivalent arrangements included within the spirit and scope of the appended claims.

What is claimed is:

1. A method of manufacturing an organic thin film transistor, the method comprising:
   forming a gate electrode,
   forming an organic semiconductor layer overlapped with the gate electrode, and
   forming a source electrode and a drain electrode electrically connected to the organic semiconductor layer,
   wherein the forming of the organic semiconductor layer includes
      forming an organic semiconductor thin film,
      forming a hydrophilic nanolayer on the organic semiconductor thin film,
      forming a protective interlayer on the hydrophilic nanolayer, performing a photolithography of the protective interlayer, the hydrophilic nanolayer, and the organic semiconductor thin film, and removing the protective interlayer.

2. The method of claim 1, wherein the performing the photolithography of the protective interlayer, the hydrophilic nanolayer, and the organic semiconductor thin film comprises:

applying a photoresist film on the protective interlayer, disposing a mask on the photoresist film and exposing a portion of the photoresist film, developing the exposed portion of the photoresist film to form a photoresist pattern, patterning the protective interlayer, the hydrophilic nanolayer and the organic semiconductor thin film using the photoresist pattern, and removing the photoresist pattern.

3. The method of claim 2, wherein the photoresist film comprises a fluorine-containing photoresist.

4. The method of claim 1, wherein the protective interlayer comprises a material different from that of the hydrophilic nanolayer.

5. The method of claim 4, wherein the protective interlayer comprises a water-soluble organic compound.

6. The method of claim 5, wherein the hydrophilic nanolayer comprises a hydrophilic metal oxide, a hydrophilic low molecular weight compound having a molecular weight of less than or equal to about 3,000, or any combination thereof, and the hydrophilic metal oxide and the hydrophilic low molecular weight compound are insoluble in water.

7. The method of claim 1, wherein the hydrophilic nanolayer is formed by vapor deposition, and the protective interlayer is formed by a solution process.

8. The method of claim 1, wherein the removing of the protective interlayer comprises supplying water to the protective interlayer.

* * * * *